United States Patent [19]

Wu et al.

[11] 4,390,780

[45] Jun. 28, 1983

[54] LSI TIMING CIRCUIT FOR A DIGITAL DISPLAY EMPLOYING A MODULO EIGHT COUNTER

[75] Inventors: Ta-Ming Wu; Gregory E. Gaertner, both of San Diego, Calif.

[73] Assignee: Burroughs Corporation, Detroit, Mich.

[21] Appl. No.: 205,801

[22] Filed: Nov. 10, 1980

[51] Int. Cl.³ .................. G06F 3/14; H03K 1/17; H03K 21/36; H04N 5/06
[52] U.S. Cl. .................. 377/44; 328/187; 340/744; 340/804; 358/150; 364/521; 377/33; 377/43; 377/46
[58] Field of Search ....... 235/92 NG, 92 CC, 92 LG, 235/92 GT, 92 T, 92 FQ, 92 TF; 328/43, 187; 307/223 R; 364/521; 340/744, 749, 750, 801, 804; 358/150, 148

[56] References Cited

U.S. PATENT DOCUMENTS

| | | | |
|---|---|---|---|
| 3,777,063 | 12/1973 | Meacham | 358/150 |
| 3,816,764 | 6/1974 | King | 328/187 |
| 3,896,388 | 7/1975 | Hatsukano | 328/43 |
| 3,920,901 | 11/1975 | Boehly | 358/150 |
| 4,119,954 | 10/1978 | Seitz | 340/750 |
| 4,196,431 | 4/1980 | Lee | 358/150 |

OTHER PUBLICATIONS

*IBM Technical Disclosure Bulletin,* vol. 3, No. 1, Jun. 1960, pp. 25-27, L. R. Harper, "Folded Ring".

*Primary Examiner*—Howard Britton
*Attorney, Agent, or Firm*—Mervyn L. Young; Kevin R. Peterson

[57] ABSTRACT

This disclosure relates to a timing circuit for a digital display, which circuit includes a series of counters, each having four stages such that each counter will drive the next stage only when it has progressed from zero to seven. By reading out the state of each stage of the respective counters, selected counts can be decoded from only two of the respective stage readouts.

10 Claims, 11 Drawing Figures

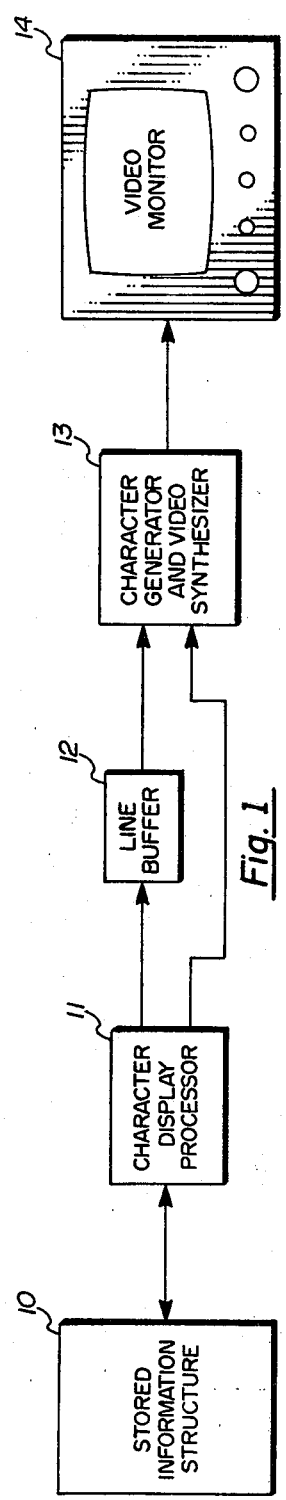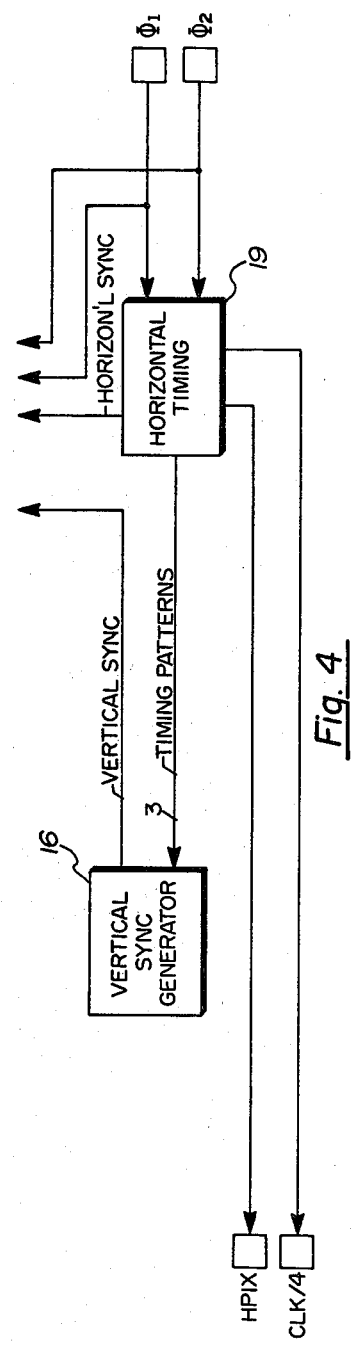

| | A | B | C | D | DECODE | | A | B | C | D | DECODE |
|---|---|---|---|---|---|---|---|---|---|---|---|
| 0 | 0 | 0 | 0 | 0 | $\bar{A}\,\bar{D}$ | 0 | 1 | 1 | 1 | 1 | A D |
| 1 | 1 | 0 | 0 | 0 | A $\bar{B}$ | 1 | 0 | 1 | 1 | 1 | $\bar{A}$ B |
| 2 | 1 | 1 | 0 | 0 | B $\bar{C}$ | 2 | 0 | 0 | 1 | 1 | $\bar{B}$ C |
| 3 | 1 | 1 | 1 | 0 | C $\bar{D}$ | 3 | 0 | 0 | 0 | 1 | $\bar{C}$ D |
| 4 | 1 | 1 | 1 | 1 | A D | 4 | 0 | 0 | 0 | 0 | $\bar{A}\,\bar{D}$ |
| 5 | 0 | 1 | 1 | 1 | $\bar{A}$ B | 5 | 1 | 0 | 0 | 0 | A $\bar{B}$ |
| 6 | 0 | 0 | 1 | 1 | $\bar{B}$ C | 6 | 1 | 1 | 0 | 0 | B $\bar{C}$ |
| 7 | 0 | 0 | 0 | 1 | $\bar{C}$ D | 7 | 1 | 1 | 1 | 0 | C $\bar{D}$ |

LSI TIMING CIRCUIT FOR A DIGITAL DISPLAY EMPLOYING A MODULO EIGHT COUNTER

BACKGROUND OF THE INVENTION

1. Field of the Invention

This invention relates to a modulo eight counter and more particularly to such a counter for the provision of timing signals in a digital display unit.

2. Description of the Prior Art

In order to reduce the manufacturing costs of the circuitry for a digital display unit, it is desirable to achieve as many functions on a single integrated circuit chip as permissable, either by increasing the packing density of the gates in the chip or by novel circuit designs and architecture creation. This in turn leads to wider use of the digital display units to in turn accommodate more applications for information processing systems.

Such digital display units may be custom made or may be formed of conventional commercial television sets. In either case, the information displayed is usually of the nature of characters formed of dot matrix where the display unit employs a raster scan mode. Each horizontal line is divided into a number of discrete points or areas called picture elements (PELS) or pixels. A fraction of such picture elements per line is not employed for information display but is that portion of the scan time required for horizontal retrace and synchronization of the horizontal oscillator.

As the display screen is scanned, the dot matrix characters are formed by character generation circuits that control the modulation of the electron beam (in the case of CRT displays), individual circuits of which are selected by character codes that are stored in the memory. This code store can be a shift register with exactly the same number of cells as there are character positions on the display screen, or it may be a random access memory.

In some display units, 25 to 30 complete scans of all the lines making up the display are made per second. Thus, each portion of a character being displayed is on display 25 to 30 times a second for a brief period and this can cause an apparent flickering. The flickering problem is normally solved by refreshing or redrawing all the lines in the display in two consecutive interlaced scans. A "half-scan" is redrawn or refreshed in half the time. Because of the 2:1 interlace between the two half-scans, if a horizontal line is drawn in one half-scan and is adjacent to a line drawn in the next half-scan, the two form a line on the display screen with reduced flicker because, in essence, it is written twice as often. Applying this knowledge, a 6×8 dot matrix character can be displayed on a 12×16 dot matrix, by displaying each dot in the 6×8 matrix four times. This reduces flicker considerably, as the character now seems to be written 50 to 60 times a second, instead of 25 to 30 times.

In modern practice, the character generation circuits and the code stores are implemented in integrated circuitry where care must be given to the number of gates and resultant capacitance involved so as to allow the circuitry to operate at very high speeds to generate the appropriate signals to drive the display. Such integrated circuitry is driven by a clock with the appropriate timing signals required for the synchronization of the respective horizontal and vertical scans and retrace being created by a counter which counts the number of time intervals required for restarting the various scans and other events.

In the past, such a counter has been a binary counter which employs a number of gates so as to make it difficult to implement for operation at very high speeds.

It is then an object of the present invention to provide an improved counter for a digital display unit.

It is another object of the present invention to provide an improved counter for a digital display unit which can be implemented with a reduced number of gates and thus reduce circuit delays.

Still another object of the present invention is to provide an improved counter that can be implemented on an integrated circuit chip for operation at very high speeds.

SUMMARY OF THE INVENTION

In order to accomplish the above objects, the present invention resides in a timing circuit for a digital display, which circuit includes a series of counters, each having four stages such that each counter will drive the next stage only when it has progressed from zero to seven. By reading out the state of each stage of the respective counters, selected counts can be decoded from only two of the respective stage readouts.

A feature, then, of the present invention resides in a series of counters, each having four stages such that each counter will drive the next stage only when it has progressed from zero to seven such that only two of the stage readouts are required to decode a selected count.

DESCRIPTION OF THE DRAWINGS

The above and other objects, advantages and features of the present invention will become more readily apparent from a review of the following disclosure when taken in conjunction with the drawings wherein:

FIG. 1 is a representation of a system employing the present invention;

FIG. 4 is a representation of the timing circuitry of FIG. 3;

GENERAL DESCRIPTION OF THE INVENTION

Figure 2A:
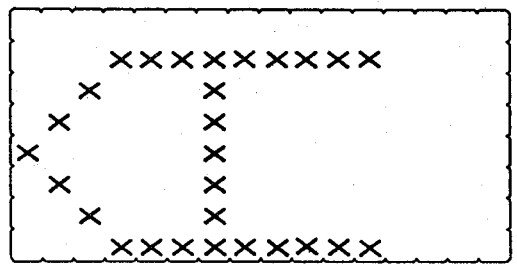
FIGS. 2A–C illustrate characters that can be displayed by the system of FIG. 1.

A digital display system of the type employing the present invention is illustrated in FIG. 1. As shown therein, stored information structures are fetched from information storage 10 by character display processor 11 which controls the communication between storage 10 and the video output circuit employing the present invention. Character codes from the display processor 11 are received by line buffer 12 for sequential presentation to the video output circuit 13. As indicated in FIG. 1, video output circuit 13 includes both the character generation circuitry and the video synthesization circuitry. The system of the present invention is adapted to provide video signals to a commercial video monitor 14.

The picture on the display monitor 14 is refreshed or redrawn a number of times per second, 25 to 30 times per second in the system in which the present system resides. For this reason, there has to be a storage for the information to be displayed during each scan of the display. Line buffer 12 of FIG. 1 provides this capability. The display area of the television screen can be divided into a coordinate system which in the system being described, has 640 picture elements on a horizontal line and 480 lines in a picture. As will be more fully described below, the timing sequence provides for an additional 140 picture elements to accommodate the retrace portion of the scan cycle. If a chosen character set were to contain, for example, characters 8 picture elements wide and 16 lines high, the character position counter would divide the screen into 80 character positions horizontally and 30 character lines vertically for an $80 \times 30 = 2,400$ characters to be displayed.

The character generator of the present invention generates the signals for each character dot-matrix pattern. For a brief explanation of this pattern, reference is now made to FIG. 2A which illustrates as an example, the dot-matrix pattern for the letter "A". The dot-matrix, in this example, is an area of 16 rows of 8 picture elements each. The character "A" is defined by those areas marked by "X's" which represent the picture element on the display screen that will be activated during the character generation or appear as light dots on the display screen with the blank areas in FIG. 2A representing dark dots or inactivated areas. The character created on the display screen is represented by the dark and light areas according to the character pattern.

Figure 2B:
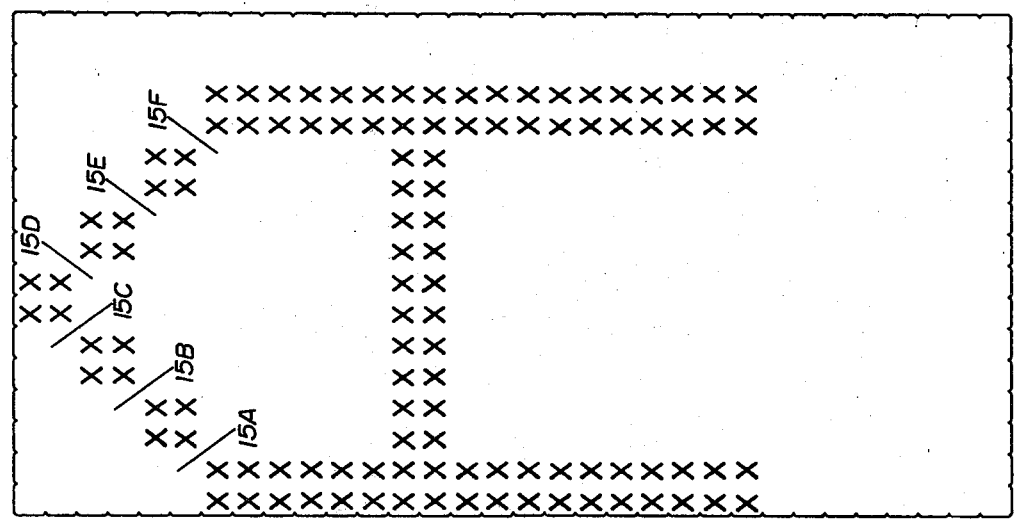
Figure 2C:
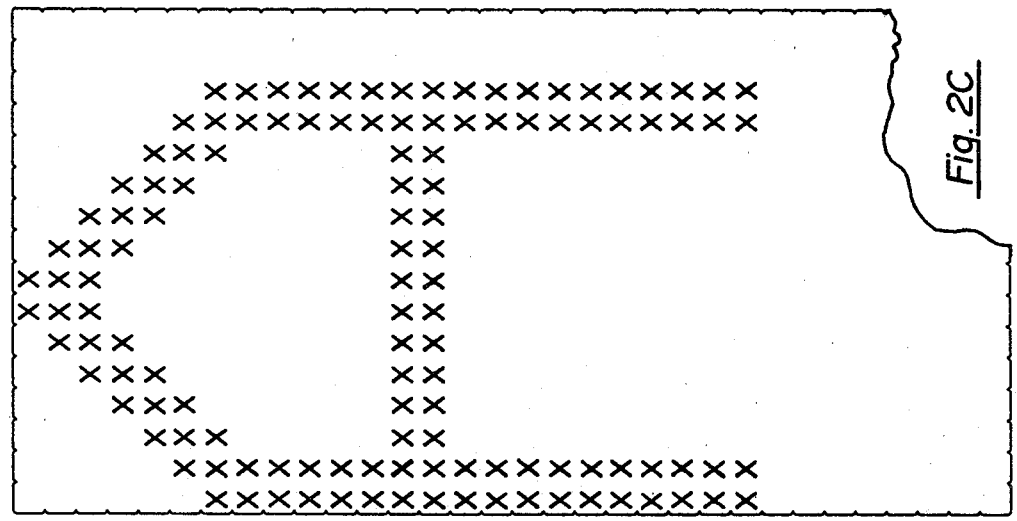

As was indicated above, it is common to employ an interlaced scan in a commercial television display to reduxce the flickering of that information as it is seen by the viewer. To this end, the individual character information generated by the character generator circuitry is displayed four times. Thus, an $8 \times 16$ character such as illustrated in FIG. 2A becomes a $16 \times 32$ character dot-matrix as illustrated in FIG. 2B. FIG. 2B appears to be ragged because of the lack of informational bits as illustrated in FIG. 2B or they are denoted by diagonal lines 15A-F. Because of the display of each informational bit four times, this results in the exclusion of "included" corners. As described in the Greer et al. application Ser. No. 178,494, filed Aug. 15, 1980, now U.S. Pat. No. 4,345,244, and in the Seitz et al. U.S. Pat. No. 4,119,954, circuitry can be provided to supply informational bits to adjacent areas whenever "included" corners are to occur. This results in the display of a character as illustrated in FIG. 2C.

The video output circuit employing the present invention can generate four character sizes depending upon two status bits, high and wide, of the status code which precedes the character code and specifies the mode in which the character is to be displayed. If both of these bits are 0, a normal sized character with 8 columns and 16 rows is generated. If the wide bit equals one, a double-width character is produced. When both the high and wide status bits equal one, a character of 32 rows and 16 columns is generated.

A row address is also provided to the video output circuitry to specify the start of each horizontal line. The row address is used with the status bits for highlights: superscript, subscript, and high, to determine which horizontal row of the character font is output for the present scan line. Other highlights can be specified by appropriate bits in the status code. The Bright and Reverse bits control the intensity levels assigned to the foreground and the background shades. These four combinations include various combinations of gray, black, and white for both the foreground and the background. When the Underline status bit is set, the two scan lines below the character are set to the foreground shade for that character. The Blank or Invisible bit causes the entire character, including the Underline, to be displayed as a background shade. When the Secure bit is set, all pixels within the character area are displayed as a foreground shade. This highlight has no effect outside of the character area, or if the Blank bit is enabled. Finally, the setting of the cursor bit reverses all pixels within the character area, i.e., pixels of the background shade are displayed as foreground shade and vice versa.

Figure 3:
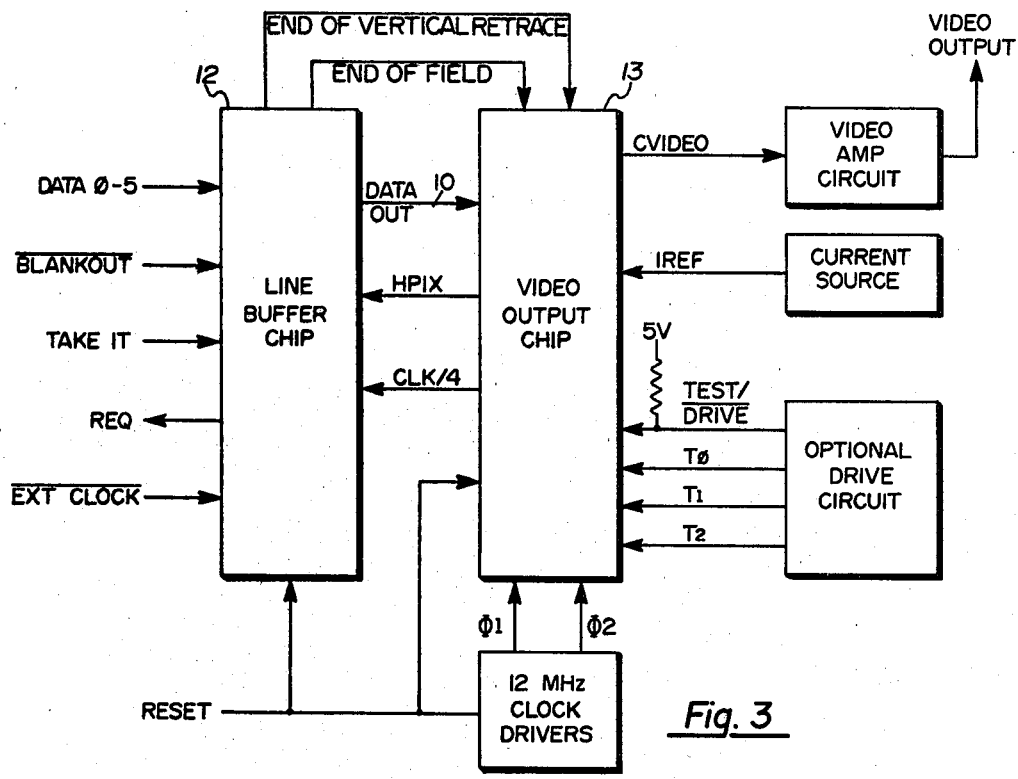
FIG. 3 is a representation of buffer and output circuitry of the system of FIG. 1.

FIG. 3 illustrates the signals that the line buffer circuit and the video output circuit employ to communicate with the rest of the system and with each other. The rate at which the 17 input signals, DATA 1-15, and BLANKOUT are shifted into the circuit is dependent upon both frequency of the external clock and the readiness of the line buffer circuit to accept new data. The readiness is characterized by the state of the REQUEST (REQ) signal. On the output side of the circuit, information is transferred to the video output circuit in 10-bit quantities at a rate exactly equal to the pixel rate divided by four. Synchronization with the video monitor is made possible through the horizontal sync signal HPIX whose main purpose is to bracket the activity part of the video scan line. The RESET line shown in FIG. 3 is common to the whole video system of synchronization during power-up. Finally, two other output leads are assigned to the END FIELD and END OF VERTICAL RETRACE signals.

The storage or line buffers are implemented by two $80 \times 20$ sequentially accessed memories. Each 20-bit word fully describes one of the 80 displayable characters. Eight bits of the character code address the character font of the video output circuit to select one of 256 characters, along with two "Font Select" bits to allow selection of a particular video output circuit. Ten bits of the status (or "highlight") information contribute to the general appearance of the character such as its size, brightness, position relative to the character line, background shade, and so forth.

Given a particular character line, the same sequence of 80 pairs of data is sent to the video output circuit for each scan line. These 160 transfers take place within 160 clock/four periods, and are preceded by a 10-bit row address which specifies which row of the character dot-matrix is to be displayed on the present scan line.

The data must be read from the line buffer a number of times equal to the scan line pairs for that particular character line. At the end of every scan line, the register holding the row address is incremented and points to the next scan to be displayed.

Communication on the input side of the line buffer circuit is attained by two signals, REQUEST and TAKE IT. When the line buffer circuit is empty and can accept a new character, it raises its REQUEST signal and keeps it high until TAKE IT signal goes high, at which time a new set of data on the data input lines is strobed into the line buffer. At this time, the line buffer circuit is able to process that particular character immediately and keeps its REQUEST signal high for another clock period, indicating it can process a second character right away. However, no more than two characters can be processed consecutively. At this time, the line buffer circuit is unable to process another character. This is characterized by the REQUEST signal going low after the second set of data has been strobed in.

Because of the nature of the video signal production, and its need to be compatible with television standards, the output signals of the system must be supplied constantly at the video frequency.

The video output circuit of FIG. 3 receives data signals that are either a row address, a status code, or a character code which are employed to specify the character to be displayed, the scan line at which the display is to start and various highlights of the display of the character. The synchronization circuitry of FIG. 3 is illustrated in more detail in FIG. 4 and includes the vertical sync generator 16 and horizontal timing circuitry 19. Vertical sync generator 16 examines a row address register. If the two high order bits of the register have been set, vertical sync generator 16 generates the vertical retrace sequence for the timing patterns provided by horizontal timing circuitry 19. In addition, horizontal timing circuitry 19 generates horizontal sync signals for the video output circuit and the respective HPIX and clock/four timing signals for the line buffer circuitry. Horizontal timing circuitry 19 also generates additional signals which are employed on various portions of the video output circuit.

DETAILED DESCRIPTION OF THE INVENTION

Figure 5:
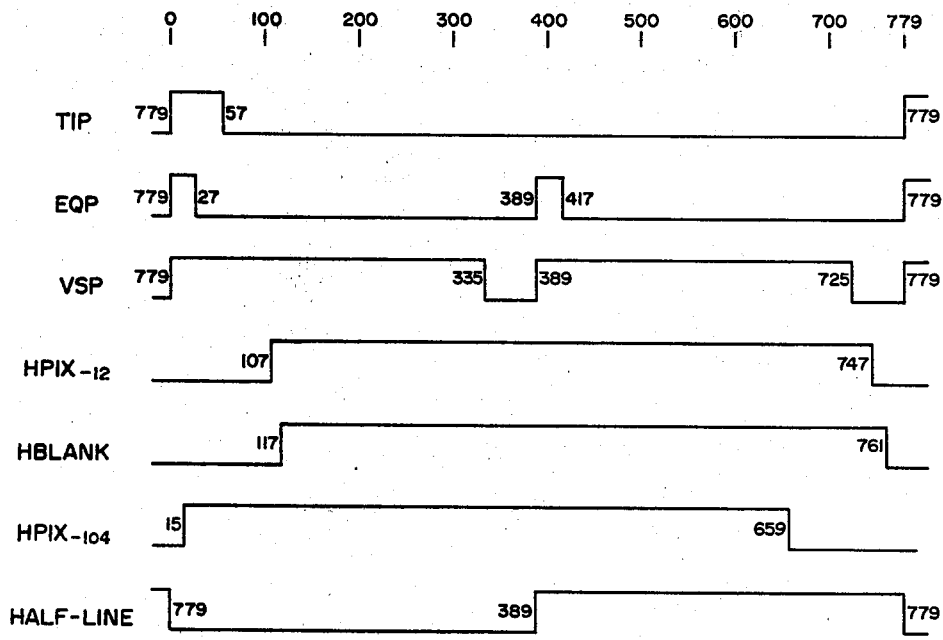
FIG. 5 illustrates waveforms generated by the present invention.

As was indicated above, the present invention is adapted for employment with a standard commercial video monitor wherein each horizontal scan line will contain 640 picture elements or pixels with an additional 140 pixel time elements being employed for the retrace portion of the scan for a total of 780 pixel time elements per scan. The timing signals required for each scan are illustrated in FIG. 5 and are adapted to conform to EIA Electrical Performance Standards for Monochrome Television Facilities, RS-170. As illustrated in FIG. 5, seven waveforms are required to be generated by the timing generator of the present invention. They are the horizontal sync pulse TIP; the equalization pulses EQP; the vertical sync pulses VSP; two horizontal sync signals HPIX, one of which is employed to drive the line buffer of FIG. 3 and the other which is employed to drive the video output circuitry; the horizontal blank signal $\overline{HBLANK}$; and the half-line signal HALFLINE. These signals will not be discussed in detail at this time except to indicate that, in FIG. 5, they are to begin and end at a different number of pixel time units, which values are a matter of design criteria. Suffice it to say that out of the 780 pixel time elements required for each horizontal scan, the respective signals are to be generated at specific times which require specific decoding circuitry. The particular specific times are listed as follows:

| Decimal | Octal | Decodes | | | | |
|---|---|---|---|---|---|---|
| 117 | 0165 | $A_2$ | $\overline{B_1}$ | $C_1$ | $A_0$ | $B_0$ |
| 761 | 1371 | E $C_2$ | | $C_1$ | $D_1$ | $A_0$ |
| 779 | 1413 | E | $D_2$ $\underline{A_1}$ | | $C_0$ | |
| 57 | 0071 | | | $C_1$ | $D_1$ | $\underline{A_0}$ |
| 15 | 0017 | $\overline{E}$ | | $A_1$ | $C_0$ | $D_0$ |
| 659 | 1223 | $\underline{E}$ $B_2$ | $\underline{B_1}$ | | $C_0$ | |
| 107 | 0153 | $\overline{E}$ $A_2$ | $\underline{A_1}$ | $B_1$ | $C_0$ | |
| 747 | 1353 | $\overline{E}$ $C_2$ | | $A_1$ $B_1$ | $C_0$ | |

-continued

| Decimal | Octal | Decodes | | | | |
|---|---|---|---|---|---|---|
| 389 | 0605 | $\overline{B_2}$ $C_2$ | | $\overline{D_1}$ | $A_0$ | $\underline{B_0}$ |
| 51 | 0063 | _ TIP | | | $C_0$ | $D_0$ |
| 417 | 0641 | $\overline{B_2}$ $C_2$ | | $D_1$ | $A_0$ | |
| 27 | 0033 | $\underline{C_2}$ | $C_1$ | | $\underline{C_0}$ | |
| 335 | 0517 | $A_2$ $B_2$ | $A_1$ | | $\underline{C_0}$ | $D_0$ |
| 725 | 1325 | E $\underline{C_2}$ | $\underline{B_1}$ | | $A_0$ | $B_0$ |
| 370 | 0562 | _ $A_2$ $\underline{B_2}$ | $B_1$ | $C_1$ | $B_0$ | |
| 4 | 0004 | $\overline{E}$ | $D_2$ | | | $D_0$ |

Figures 6A, 6B:
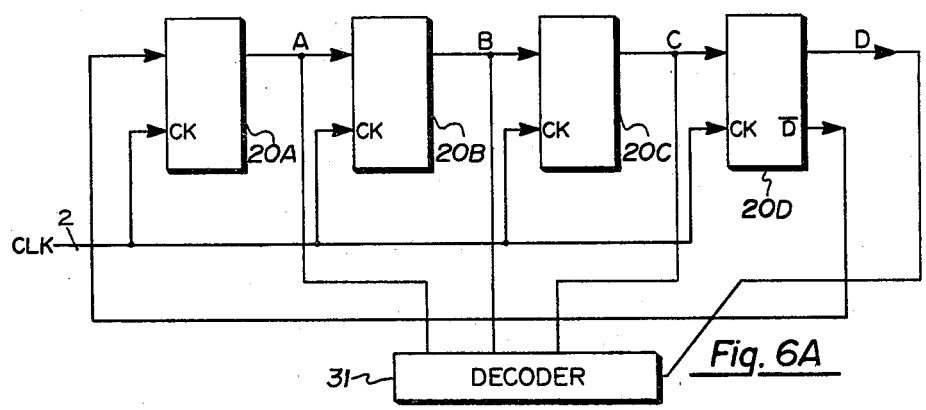
FIGS. 6A and 6B are diagrams representing a portion of the present invention.

In prior art timing circuits, a binary counter was employed which, nevertheless, required a large number of gates if it were to count to a relatively high number such as 780. In the present invention, a series of modulo eight Johnson-type counters are employed where each counter in the series counts from 0 to 7 before triggering the next order counter. The basic building block of such a counter is illustrated in FIG. 6A and shows a series of cells 20A . . . D, each of which is driven by a clock during each clock time. The order of sequence for the respective stages is illustrated in FIG. 6B. As shown therein, on the first clock period cell 20A will switch to the true state and remain there until reset by the false output of cell 20D. Correspondingly, cell 20B will switch to the true state on the second clock pulse and remain there until reset, and so forth. The outputs of the respective cells could be inverted so that two choices of decoding are available for employment by decoder 31.

Figure 7:
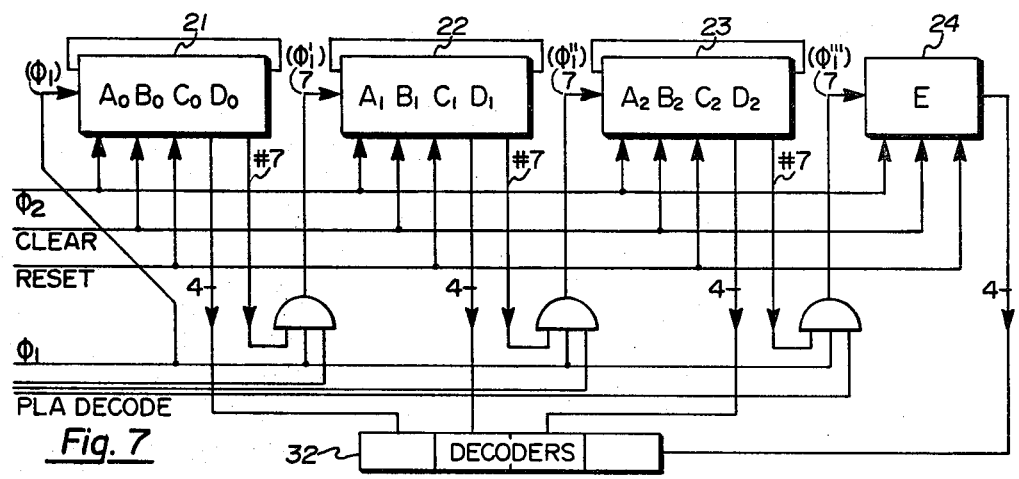
FIG. 7 is a schematic diagram of a section of the counter of the present invention.

FIG. 7 illustrates the basic structure of the counter of the present invention such that the output of stage 21 will not trigger stage 22 until it has reached a count of 7; stage 22 will not trigger stage 23 until it has reached a count of 7; and stage 23 will not trigger stage 24 until it has reached a count of 7. In this particular arrangement, stage 21 is driven by both phases of a two-stage clock while the remaining stages 22, 23, and 24 are only driven by the second phase of that clock. The stages can be cleared by a clear signal from outside of all the stages and the reset signal which is generated when the counter reaches a count of 779. The final counts are decoded by decoders 32 of FIG. 7.

A particular advantage of this type of counting arrangement is that the output of each stage of the respective shift registers can be decoded with only two-bits as was indicated above in FIG. 6B. In fact, in the above-listed table, a number of signals have been crossed out as they are not required to decode the pixel counts as required for the system of the present invention.

When the output of the E stage 24 is true, the counter is in the range of 512 to 779. This true output represents the most significant bit of the octal number being generated by the counter of the present invention.

One of the advantages of the counter of the present invention is that the repetition of the decoded numbers can be employed to reduce the number of bits which are required for decoding. For example, the TIP pulse is to go down or drop at the count of 57. This requires a separate pulse to reset the corresponding flip-flop or cell. However, the pulse at 57 can be repeated from 57 until 779 and only requires the signals $\overline{C_1}$ $D_1$ $A_0$.

For the equalization pulses, EQP, four numbers are required, namely 779, 27, 389 and 417. 27 and 417 could be repeated from 27 to 389 and also 417 to 779. 779 and 389 could be repeated from 779 to 27, and also from 389 to 417. It is to be remembered that from 512 to 779, the E bit is true. Thus 389 is on the lower side of 512 and out of the range of 779, so that it is not necessary to specify the range above 512 for the number 389.

For the decoding of 27 or octal 33, such decoding could be represented by $C_1 C_0$. However, $\overline{C_2}$ is also employed to specify octal 33 as $\overline{C_2}$ is employed to represent 0, 1, 2 or 7. With decimal numbers in the range of 0–4, only one digit is required for decoding. For 4–7, $D_0$ is all that is required to decode 4 since D is not required for decoding 0, 1, 2 or 3.

Figure 8:
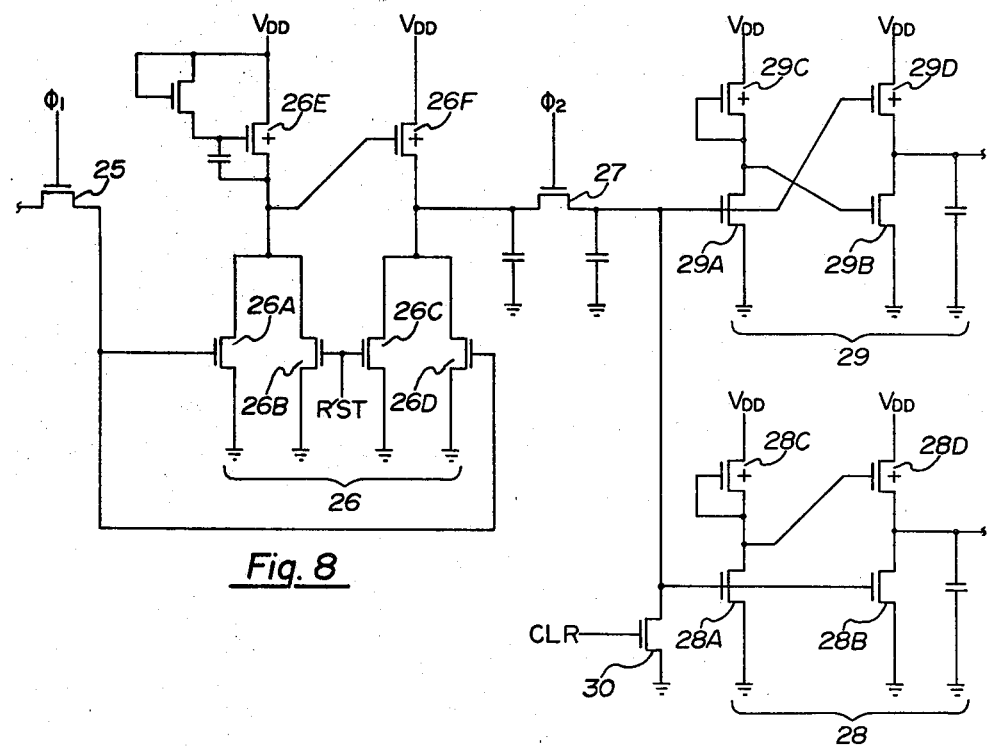
FIG. 8 is a schematic diagram of a stage of FIG. 7.

As indicated in FIG. 8, each cell is driven by two clock signals $\phi_1$ and $\phi_2$. However, this is actually only true for the first stage 21 of FIG. 7. As indicated in FIG. 7, $\phi_1'$ for stage 22 is the AND product of the $\phi_1$ clock signal and the output of stage 21. Similarly, $\phi_1''$ is employed to drive stage 23 and is the AND product of $\phi_1$ and the output of stage 22. $\phi_1'''$ is employed to drive stage 24 and is the AND product of $\phi_1$ and the output of stage 23. In addition, each AND gate requires a signal from decoders 32 which is just a set of programmable logic arrays.

The individual cell from which the shift registers of the present invention are formed is illustrated in FIG. 8. As was illustrated in FIG. 6A, the inverted output from the last cell in the shift register is supplied back to the first cell to get the sequence of signals illustrated in tables of FIG. 6B depending upon whether one chooses to use the true outputs for the decode or the inverted outputs. Thus, it will be understood in FIG. 8 that the inverted output from the last cell will be supplied back to gate 25 of the first cell to be gated in during clock time $\phi_1$. In addition, the true output of output circuit 28 will be supplied to the input of the next cell, and so forth. Output circuit 29 provides the inverse thereof due to the depletion mode nature of certain of the gates. During phase $\phi_2$ of the two-phase clock, the state of the cell is transferred to the respective output circuits 28 and 29.

EPILOGUE

A timing circuit for a digital display has been disclosed above, which circuit includes a series of counters each having four stages such that each counter will drive the next stage only when it has progressed from zero to seven. By reading out the state of each stage of the respective counters, selected counts can be decoded from only two of the respective stage readouts.

While but one embodiment of the present invention has been disclosed, it will be apparent to those skilled in the art that variations and modifications may be made therein without departing from the spirit and scope of the invention as claimed.

What is claimed is:

1. In a timing circuit for a digital display, a counter means comprising:
    a plurality of counter stages connected in series;
    each counter stage having four cells connected in series such that each counter stage will provide a drive signal to the next counter stage in the series only when the driving counter stage has progressed from zero to seven; and
    cell decoding circuitry coupled to the outputs of each cell of each counter stage such that only two cell readouts are required to decode the state of each counter stage.

2. A counter means according to claim 1 wherein:
    the fourth cell of each counter stage provides both a true signal output and an inverse signal output and the inverse signal output is coupled to the first cell of the counter stage.

3. A counter means according to claim 1 further including:
    two-phase clock means coupled to said series of counter stages to provide two clock signals in alternating phases.

4. A counter means according to claim 3 further including:
    gating means;
    said clock means providing one of said clock signals to all of said stages and the other clock signal to the first stage;
    said gating means being coupled between said clock means and said stages other than said first stage to gate said other clock signal to said other stages at selected intervals.

5. A counter means according to claim 4 wherein:
    said other clock signal is gated to said other stages when there is an output signal from a preceding stage.

6. A counter means according to claim 5 wherein:
    said output signal from said preceding stage represents a count from zero to seven.

7. In a video output circuit for a digital display, a timing circuit for providing horizontal and vertical synchronization pulses for the scan lines of the display, said timing circuit comprising:
    a plurality of counter stages connected in series;
    each counter stage having four cells connected in series such that each counter stage will provide a drive signal to the next counter stage in the series only when the driving counter stage has progressed from zero to seven;
    said fourth cell of each counter providing both a true signal output and an inverse signal output with the inverse signal output being coupled to the first cell of said each counter stage; and
    cell decoding circuitry coupled to the outputs of each cell of each counter stage such that only two cell readouts are required to decode the state of each counter stage.

8. The combination according to claim 7 further including:
    two-phase clock means coupled to said series of counter stages to provide two clock signals in alternating phases.

9. A counter means according to claim 8 further including;
    gating means;
    said clock means providing one of said clock signals to all of said stages and the other clock signal to the first stage;
    said gating means being coupled between said clock means and said stages other than said first stage to gate said other clock signal to said other stages at selected intervals.

10. A counter means according to claim 9 wherein:
    said other clock signal is gated to said other stages when there is an output signal from a preceding stage.

* * * * *